United States Patent
Norman et al.

(10) Patent No.: US 6,570,404 B1
(45) Date of Patent: *May 27, 2003

(54) HIGH-PERFORMANCE PROGRAMMABLE LOGIC ARCHITECTURE

(75) Inventors: Kevin A. Norman, Belmont; Rakesh H. Patel, Cupertino; Stephen P. Sample, Saratoga, all of CA (US); Michael R. Butts, Portland, OR (US)

(73) Assignee: Altera Corporation, San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/824,535

(22) Filed: Mar. 26, 1997

Related U.S. Application Data

(60) Provisional application No. 60/014,440, filed on Mar. 29, 1996.

(51) Int. Cl.[7] .............................................. H03K 19/177
(52) U.S. Cl. .............................. 326/39; 326/40; 326/41; 326/38
(58) Field of Search ............................ 326/16, 37, 38, 326/39, 40, 41, 47; 371/22.1, 22.2

(56) References Cited

U.S. PATENT DOCUMENTS

| | | |
|---|---|---|
| 4,775,942 A | 10/1988 | Ferreri et al. |
| 4,870,302 A | 9/1989 | Freeman |
| 4,922,441 A | 5/1990 | Tsukagoshi et al. |

(List continued on next page.)

FOREIGN PATENT DOCUMENTS

| | | |
|---|---|---|
| DE | 31 49 460 A1 | 6/1963 |
| EP | 0 461 798 A2 | 12/1991 |
| EP | 0 507 507 A2 | 10/1992 |
| EP | 0 507 507 B1 | 7/1997 |

OTHER PUBLICATIONS

Application Note 39, "JTAG Boundary–Scan Testing in Altera Devices," Altera Corporation, San Jose, Ca, Nov. 1995, ver. 3, pp. 1–28.

(List continued on next page.)

*Primary Examiner*—Michael Tokar
(74) *Attorney, Agent, or Firm*—Townsend and Townsend and Crew LLP

(57) ABSTRACT

A programmable logic device architecture. This programmable logic architecture includes a first logic block (425) containing programmable logic elements for performing logic functions. The architecture may also include a diagnostic block interface (415), which interfaces with the first logic block (425), for performing JTAG functions, configuring the first logic block (425), initializing the first logic block (425), interfacing with off-chip diagnostic and test devices and equipment, and performing other similar functions. The first logic block (425) may be programmably coupled to other components on the integrated circuit using a first programmable interconnect network (511). The first logic block (425) includes a plurality of second logic blocks (505) which may be programmably coupled using a second programmable interconnect network (521). The second programmable interconnect network (521) may be programmably coupled to the first programmable interconnect network (511). Furthermore, the plurality of second logic blocks (505) include a plurality of third logic blocks (525) which may be programmably coupled using a third programmable interconnect network (535). A signal from a third logic block (525) may be programmably coupled to the other logic blocks, the diagnostic block interface (415), and other circuitry on the integrated circuit. The internal circuitry of these logic blocks may be monitored through a variety of programmable interconnect paths. This architecture is useful when debugging a design, especially for emulation and prototyping applications.

38 Claims, 10 Drawing Sheets

U.S. PATENT DOCUMENTS

| | | | |
|---|---|---|---|
| 4,924,468 | A | 5/1990 | Horak et al. |
| 5,036,473 | A | 7/1991 | Butts et al. |
| 5,109,353 | A | 4/1992 | Sample et al. |
| 5,122,685 | A | 6/1992 | Chan et al. |
| 5,140,193 | A | 8/1992 | Freeman, deceased et al. |
| 5,208,491 | A | 5/1993 | Ebeling et al. |
| RE34,363 | E | 8/1993 | Freeman, deceased |
| 5,255,203 | A | 10/1993 | Agrawal et al. |
| RE34,444 | E | 11/1993 | Kaplinsky |
| 5,260,611 | A * | 11/1993 | Cliff et al. ............... 326/39 |
| 5,260,881 | A | 11/1993 | Agrawal et al. |
| 5,315,178 | A | 5/1994 | Snider |
| 5,323,069 | A | 6/1994 | Smith, Jr. |
| 5,329,470 | A | 7/1994 | Sample et al. |
| 5,343,406 | A | 8/1994 | Freeman et al. |
| 5,345,580 | A | 9/1994 | Tamaru et al. |
| 5,352,123 | A | 10/1994 | Sample et al. |
| 5,359,536 | A | 10/1994 | Agrawal et al. |
| 5,376,844 | A | 12/1994 | Pedersen et al. |
| 5,384,499 | A | 1/1995 | Pedersen et al. |
| 5,396,126 | A | 3/1995 | Britton et al. |
| 5,424,589 | A | 6/1995 | Dobbelaere et al. |
| 5,425,036 | A | 6/1995 | Liu et al. |
| 5,452,231 | A | 9/1995 | Butts et al. |
| 5,455,525 | A | 10/1995 | Ho et al. |
| 5,457,409 | A | 10/1995 | Agrawal et al. |
| 5,457,410 | A | 10/1995 | Ting |
| 5,477,475 | A | 12/1995 | Sample et al. |
| 5,519,629 | A | 5/1996 | Snider |
| 5,530,958 | A | 6/1996 | Agarwal et al. |
| 5,544,069 | A | 8/1996 | Mohsen |
| 5,574,388 | A | 11/1996 | Barbier et al. |
| 5,612,891 | A | 3/1997 | Butts et al. |
| 5,617,042 | A | 4/1997 | Agrawal |
| 5,630,088 | A | 5/1997 | Gupta et al. |
| 5,642,058 | A | 6/1997 | Trimberger et al. |
| 5,649,176 | A | 7/1997 | Selvidge et al. |
| 5,659,716 | A | 8/1997 | Selvidge et al. |
| 5,671,432 | A | 9/1997 | Bertolet et al. |
| 5,682,107 | A | 10/1997 | Tavana et al. |
| 5,729,752 | A | 3/1998 | Snider et al. |
| 5,732,407 | A | 3/1998 | Mason et al. |
| 5,754,827 | A | 5/1998 | Barbier et al. |
| 5,777,489 | A * | 7/1998 | Barbier ............... 326/16 |
| 5,790,771 | A | 8/1998 | Culbertson et al. |
| 5,790,832 | A | 8/1998 | Barbier et al. |
| 5,821,773 | A | 10/1998 | Norman et al. |
| 5,999,725 | A | 12/1999 | Barbier et al. |
| 6,057,706 | A | 5/2000 | Barbier et al. |
| 6,289,494 | B1 | 9/2001 | Sample et al. |

OTHER PUBLICATIONS

Amerson, Rick, et al., "A Twenty–Seven Chip MCM–C, " International Conference and Exhibition, Mullichip Modules, Colorado, Apr. 13–15, 1994, vol. 2256, pp. 578–582.

Hill, Dwight D., et al., "Preliminary Description of Tabula Rasa, an Electrically Reconfigurable Hardware engine," Proceedings 1990 IEEE International Conference on Computer Design: VLSI in Computers & Processors, 1990; pp. 391–395.

Chan, Pak K., et al., "Architectural Tradeoffs in Field–Programmable–Device–Based Computing Systems," Proceedings IEEE Workshop on FPGAs for Custom Computing Machines, Nape, Calif., Apr. 5–7, 1993, pp. 152–161.

Rose, Jonathan, et al., "Architecture of Field–Programmable Gate Arrays: The Effect of Logic Block Functionally on Area Efficiency," IEEE JOURNAL OF SOLID–STATE CIRCUITS, Oct. 1990, vol. 25, No. 5, pp. 1217–1225.

Morales, Luis, "Boundary Scan In XC4000 Devices," Application Note XAPP 017.002, The Programmable Logic Data Book, Xilinx, Inc. 1993, pp. 8–25–8–35, San Jose Ca., USA.

Walters, Stephen, "Computer–Aided Prototying for ASIC–Based Systems," IEEE Design & Test Computers, Jun. 1991, pp. 4–10.

Kean, Tom et al., "CONFIGURABLE HARDWARE: TWO CASE STUDIES OF MICRO–GRAIN COMPUTATION," *Systolic Array Processors,*Contributions by Speakers at the International Conference on Systolic Arrays, Killamey, Co. Kerry, Ireland, Prentice Hall UK 1989, pp. 310–319.

Wieler, Richard W., et al., "Emulating Static Faults Using a Xilinx Based Emulator," Proceedings IEEE Symposium on FPGAs for Custom Computing Machines, Nape Calif., Apr. 19–21, 1995, pp. 110–115.

Burgun, L. et al., "First Generation of Meta–Systems Equipment Emulators," Symposium on New Machine Architectures, Meta–Systems, Saclay, France, 1996, English translation 36 pp.

Khan, Ubaid R., et al., "FPGA Architectures for ASIC Hardware Emulators," Proceedings Sixth Annual IEEE International ASIC Conference and Exhibit, 1993, pp. 336–340.

Vitanen, J., et al., "Image Pattern Recognition Using Configurable Logic Cell Arrays," *New Advances In Computer Graphics,*Proceedings of CG International '89, Springer–Verlag Tokyo, Japan, 1989, pp. 365–368.

Kean, Tom et al., "Implementation of Configurable Hardware Using Wafer Scale Integration," 1990 Proceedings International Conference on Wafer Scale Integration, San Francisco, Calif., Jan. 23–25, 1990, pp. 68–73.

Bertin, P., et al., "Introduction to Programmable Active memories,"*Systolic Array processors,* Contributions by Speakers at the International Conference on Systolic Arrays, Kilarney, Co. Kerry, Ireland, Prentice Hall UK 1989, pp. 301–309.

Landman, Bernard S. et al. "On a Fin Versus Block Relationship For Partitions of Logic Graphics," IEEE Transactions on Computers, Dec. 1971, vol. C–20, No. 12, pp. 1469–1479.

Hill, Dwight, et al., "The Benefits of Flexibility in Lookup Table–Based FPGAs," IEEE Transactions on Computer–Aided Design of Integrated Circuits and Systems, Feb. 1993, vol. 12, No. 2, pp. 349–353.

Culbertson, W. Bruce, et al., "The HP Tsutsuji Logic Synthesis System," Hewlett–Packard Journal, Aug. 1983, vol. 44, No. 4, pp. 38–51.

Casselman, Steven, "Virtual Computing and The Virtual Computer," Proceedings IEEE Workshop on FPGAs for Custom Computing Machines, Napa, Calif., Apr. 5–7, 1993, pp. 43–48.

McDonald J.F., et al. "Wafer Scale Integration (WSI) of Programmable Gate Arrays (PGA's) " 1990 Proceedings International Conference on Wafer Scale Integration, San Francisco, Ca., Jan. 23–25, 1990, pp. 329–338.

Agarwal, Aditya A., et al., "Routing Architectures for Hierarchical Field Programmable Gate Arrays," FPGA '94, 2nd International ACM/SIGDA Workshop on Field–Programmable Gate Arrays, 1994, pp. 1–10.

Amerson, R., et al., "Plasma: An FPGA for Million Gate Systems," FPGA'96, International ACM/SIGDA Workshop on Field–Programmable Gate Arrays, Monterey, CA, USA, 1996, pp. 10–16.

Cliff, Richard et al., "A Dual Granularity and Globally Interconnected Architecture for a Programmable Logic Device," IEEE 1993 Custom Integrated Circuits Conference, 1993, pp. 7.3.1–7.3.5.

Rose, Jonathan, et al., "Architecture of Field–Programmable Gate Arrays, " Proceedings of the IEEE, Jul. 1991, vol. 81, No. 7, pp. 1013–1028.

Hartmann, Robert, Ed., "Erasable Programming Logic Devices," Chapter 4 of *Field–Programmable Gate Array Technology,* Kluwer Academic Publishers, Norwell, MA, USA, 1994, pp. 186–193.

Whetsel, Lee, "At–Speed Board Test Simplified via Embeddable Data Trace/Compaction IC," Conference Record, IEEE Systems Readiness Technology Conference, Anaheim, CA, USA, Sep. 24–26, 1991, pp. 307–315.

Burgun, L., et al., "Premiere generation d'Emulateurs Materials Meta–Systems," Symposium Architectures Nouvelles de Machines, Rennes, 1996, 24 pp. (copies of transparencies).

Morales, Luls, "Boundary Scan in XC4000 Devices," The Programmable Logic Data Book, 1993, XAPP 0 17.002, Xilinix, San Jose, CA, USA, pp. 8–25 to 8–35.

XILINX, The Programmable Gate Array Data Book, 1988, 8 Sections, San Jose, CA, USA, pp. 1–1 through 8–5.

XILINX, The Programmable Gate Array Design Handbook, First edition, 1986, 4 sections, 3 appendices, pp. 1.1–4–32, appendices A–i through A–10, San Jose, CA, USA.

XILINX, The Programmable Logic Data Book, 1993, 10 sections, San Jose, CA, USA, pp. 1–1 to 10–8.

Snider, Greg, et al., "The Teramac Configurable Compute Engine, " *Field–Programmable Logic and Applications,* 5th International Workshop, FPL '95; Oxford, United Kingdom, Aug. 29 to Sep. 1, 1995, 10 pp.

Amerson, R., et al., "Teramac–Configurable Custom Computing," IEEE Symposium on FPGAs for Custom Computing Machines; Apr. 19–21, 1995, Napa Valley, CA 94304, pp. 32–38.

Wilton, S. et al., "Architecture of Centralized Field–Configurable Memory", FPGA '95, 3rd International ACM/SIGDA Workshop on Field–Programmable Gate Arrays, 1995, pp. 97–103.

Bhat, N., et al., "Performance–Oriented Fully Routable Dynamic Architecture For A Field Programmable Logic Devices," Electronics Research Laboratory, College of Engineering, University of California, berkeley; Jun. 1, 1993, pp. 1–21 with, 16p. Appendix.

Dobberlaere, E., et al., "Field Programmable MCM Systems–Design of an Interconnection frame," First International ACM/SIGDA Workshop on Field Programmable Gate Arrays; Feb. 16 to 18, 1999, pp. 52–56.

XILINX, "XC4000 Logic Cell Array Family," *The XC4000 Data Book*; Product Description, Aug. 1992, pp. 1–64.

XILINX, "Virtex 2.5 V Field Programmable Gate Arrays," Final Products Specification, Oct. 6, 2000, pp. 1–72.

Hauck, Scott, "Declaration of Prof, Scott A. Hauck in Opposition to Montor's Preliminery Injuction" Civil action No. C00–03291 Sl; Confidential Information Redacted; Feb. 1, 2001, pp. 1–61.

McCluskey, Edward, "Declaration of Dr. Edward J. McCluskey in Opposition to Mentor's Motion for a Preliminary Injuction," Civil Action No. C00–03291 Sl; Feb. 1, 2001, pp. 1–19; Curriculum Vitae of Edward J. McCluskey, pp. 1–35.

* cited by examiner

L1 and L2 Partial Crossbar

HIGH-PERFORMANCE PROGRAMMABLE LOGIC ARCHITECTURE

This application claims the benefit of U.S. Provisional Application No. 60/014,440, filed Mar. 29, 1996, incorporated herein by reference.

BACKGROUND OF THE INVENTION

The present invention relates to the field of programmable logic integrated circuits. More specifically, the present invention provides an enhanced programmable logic architecture, improving upon the composition, configuration, and arrangements of logic array blocks (LABs) and logic elements (LEs) and also the interconnections between these logic array blocks and logic elements.

Programmable Logic Devices (PLDs) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known Classic™, MAX® 5000, MAX® 7000, FLEX® 8000, and FLEX® 10K products made by Altera Corp.

PLDs are generally known in which many LABs are provided in a two-dimensional array. Further, PLDs have an array of intersecting signal conductors for programmably selecting and conducting logic signals to, from, and between the LABs. LABs contain a number of individual programmable logic elements (LEs) which provide relatively elementary logic functions such as NAND, NOR, and exclusive OR.

Resulting from the continued scaling and shrinking of semiconductor device geometries which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks.

While such devices have met with substantial success, such devices also meet with certain limitations, especially in situations in which the provision of more complex logic modules and additional or alternative types of interconnections between the logic modules would have benefits sufficient to justify the additional circuitry and programming complexity. There is also a continuing demand for logic devices with larger capacity. This produces a need to implement logic functions more efficiently and to make better use of the portion of the device which is devoted to interconnecting individual logic modules.

Furthermore, general purpose programmable logic devices are not generally especially designed for special applications such as emulation and ASIC prototyping. While these general purpose programmable logic devices may have served adequately in the initial development of these applications, it has become increasingly clear that for these applications, general purpose devices have some significant drawbacks. Many general purpose programmable logic devices typically emphasize speed and density above other goals. In order to be cost effective for most applications, a general purpose programmable logic architecture attempts to provide routing resources sufficient to give a good chance of fitting a design, and allowing the utilization of most of the available logic gates in the integrated circuit. However, with a general purpose programmable logic architecture, there is always a possibility that a given design or partition may not be implementable even through the gate count is within the rated capacity of the chip.

General purpose programmable logic devices have also typically not supported easy user-probing of internal state information inside the integrated circuit. In a general purpose PLD, any net which is of interest must be brought out to a pin explicitly in the design netlist. This augmentation of the netlist to provide for state observability and controllability often forces a significantly different set of placement decisions on the fitting and routing software. In these cases, the act of setting up to observe a signal may significantly alter the detailed timing of that or other signals. In short, an attempt to observe the event alters the event.

In an application such as an emulation system, there may be very many (e.g., possibly tens of thousands) programmable logic chips. A large design netlist will be partitioned over the collection of chips. If any (one or more) particular design partition does not fit into the assigned programmable logic chip, then the whole system will not be properly implemented. Consequently, it is vital that each and every partition fit and route individually. It is also important that incremental changes to the netlist should result in proportional impacts on the partitioning, fitting and routing. Furthermore, when used for emulation, the programmable logic device should have highly predictable routability, capacity, and timing characteristics.

Furthermore, when partitioning large designs into a number of programmable logic chips, it is desirable that the timing of the original netlist be preserved, which may not be the case if the programmable logic architecture does not provide features to allow this. When partitioning designs into a number of chips, signal path delays may be expanded, but not necessarily uniformly. These differences in signal path delays may introduce timing problems including skews, setup, and hold time violations which are not inherent in the design netlist. Furthermore, timing problems which are present in the design netlist will be hidden by the mapping into multiple programmable logic devices. Existing programmable logic architectures generally do not include adequate means for detecting these types of introduced timing problems and effective means for removing these problems.

As can be seen, an improved programmable logic device architecture is needed, especially programmable logic elements and interconnect networks which improve the organization of logic modules for particular applications including emulation and prototyping.

SUMMARY OF THE INVENTION

The present invention is a programmable logic device architecture. The architecture provides flexibility and a great deal of design routability. Many features of the architecture of the present invention ares especially well-suited for use in emulation and rapid prototyping applications.

This programmable logic architecture includes a logic block L2 and a diagnostic block interface. Logic block L2 includes a plurality of logic blocks L1 and an X2 programmable interconnect network. The X2 programmable interconnect network programmably couples signals between the plurality of logic blocks L1. Also, the X2 programmable interconnect network programmably couples signals between the logic block L2 and the diagnostic block interface and a plurality of programmable I/O pins of the integrated circuit. Each of the plurality of logic blocks L1 includes a plurality of logic blocks L0 and an X1 programmable interconnect. The X1 programmable interconnect network is used to programmably couple the logic blocks L0, and to programmably couple logic blocks L0 to the X2 programmable interconnect block. Each of the logic blocks L0 includes a plurality of LE logic elements and an X0 programmable interconnect network. In some embodiments of the present invention, logic blocks L0 may further include a secondary or auxiliary logic block. The X0 programmable interconnect network programmably couples signals between LEs, and the X1 interconnect network.

Using the architecture of the present invention, signals from the various logic blocks may be programmably coupled to other logic blocks, and to logic blocks at different levels. The architecture may also include a diagnostic block interface, which interfaces with logic block L2, for performing functions such as JTAG, functions, configuring logic block L2, initializing logic block L2, interfacing with off-chip diagnostic and test devices and equipment, and other similar functions. Logic block L2 interfaces with the other components of the integrated circuit such as the diagnostic block interface using the X2 programmable interconnect network.

In the present invention, the internal circuitry of the various logic blocks may be monitored through a variety of programmable interconnect paths. This architecture is useful when debugging a design, especially for emulation and prototyping applications. For example, the present architecture provides, among other features: predictable logic, routing, and pin-out capacity; predictable and easily modified timing characteristics; and user-available diagnostic capabilities, including state observability. The present architecture may be used for debugging intensive applications where the probability of placement and routing success per chip is more of a concern than the operating speed path of the completed system.

Other objects, features, and advantages of the present invention will become apparent upon consideration of the following detailed description and the accompanying, drawings, in which like reference designations represent like features throughout the figures.

DESCRIPTION OF THE SPECIFIC EMBODIMENTS

Figure 1:
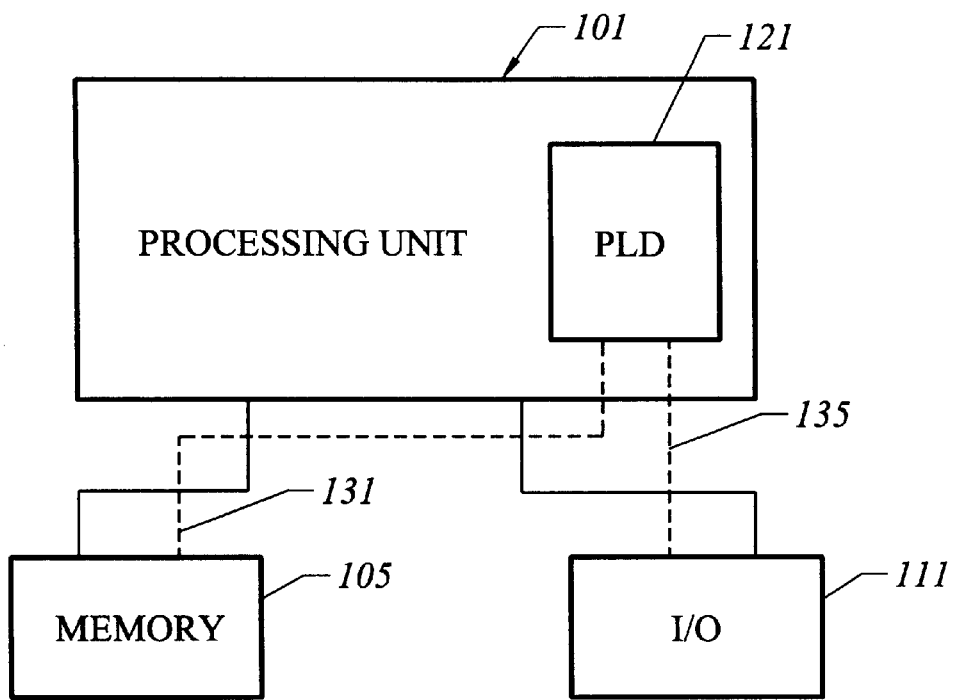
FIG. 1 is a block diagram of a digital system incorporating a programmable logic device integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices (sometimes referred to as PALs, PLAs, FPLAs, PLDs, EPLDs, EEPLDs, LCAs, or FPGAs), are well known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, and the *Altera Data Book*, March 1995, all incorporated herein by reference. The latter are described in, for example, U.S. Pat. Nos. 5,258,668, 5,260, 610, 5,260,611 and 5,436,575, and the *Altera Data Book*, March 1995, all incorporated herein by reference for all purposes. Logic devices and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
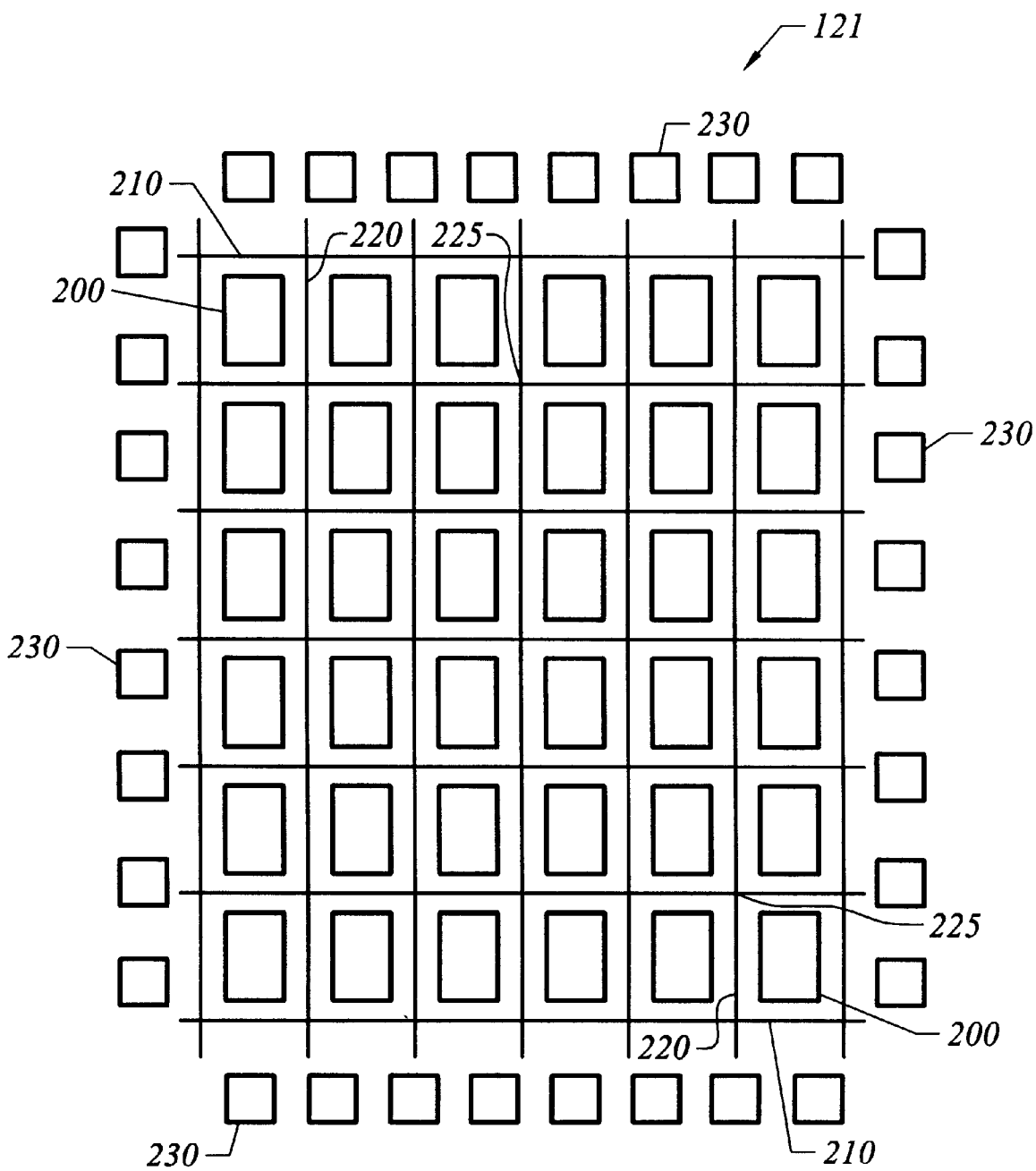
FIG. 2 is a block diagram showing the overall architecture of a programmable logic device.

FIG. 2 is a simplified block diagram of the overall internal architecture and organization of a programmable logic device. Many details of PLD architecture, organization, and circuit design are not necessary for an understanding of the present invention and such details are not shown in FIG. 2. FIG. 2 and the following description are representative of a programmable logic device architecture pioneered by Altera Corporation. An understanding of this programmable logic architecture may be useful for a better understanding and appreciation of the present invention.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Some PLDs may even contain a single LAB. However, generally in the future, as technology advances and improves, programmable logic devices with even greater numbers of logic array blocks will undoubtedly be created.

Furthermore, LABs 200 need not be organized in a square or rectangular matrix. While a rectangular or square array is generally an efficient layout structure, any arrangement of LABs inside the PLD may be conceived. For example, the array may be organized in a five-by-seven or a twenty-by-seventy matrix of LABs. Furthermore, in some circumstances, some number of LABs may be replaced by different programmable structures.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Also, in some embodiments, intersection 225 may have programmable drivers for selecting the signal from a conductor in one direction and buffer the signal and drive it onto one of the alternate conductors in the same or different direction. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The global interconnect may contain long and segmented conductors. Long conductors run the entire length or width of PLD 121. In particular, long conductors may programmably couple LABs along a length or width of PLD 121. Segmented conductors are for shorter length interconnections. For example, segmented conductors may include double lines for interconnections between two LABs 200. Other segmented conductors include, among other, triple lines, quadruple lines, quintuple lines, sextuple lines, and other similar interconnection resources. Furthermore, at intersections 225, segmented conductors may be programmable coupled (or programmably uncoupled) to other long or segmented conductors, in the same or different direction. Intersection 225 may sometimes be referred to as a "switch box." As an example, a double line may be programmably coupled to other double, long, or segmented lines, in the same or different direction, at intersections 225.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3A:
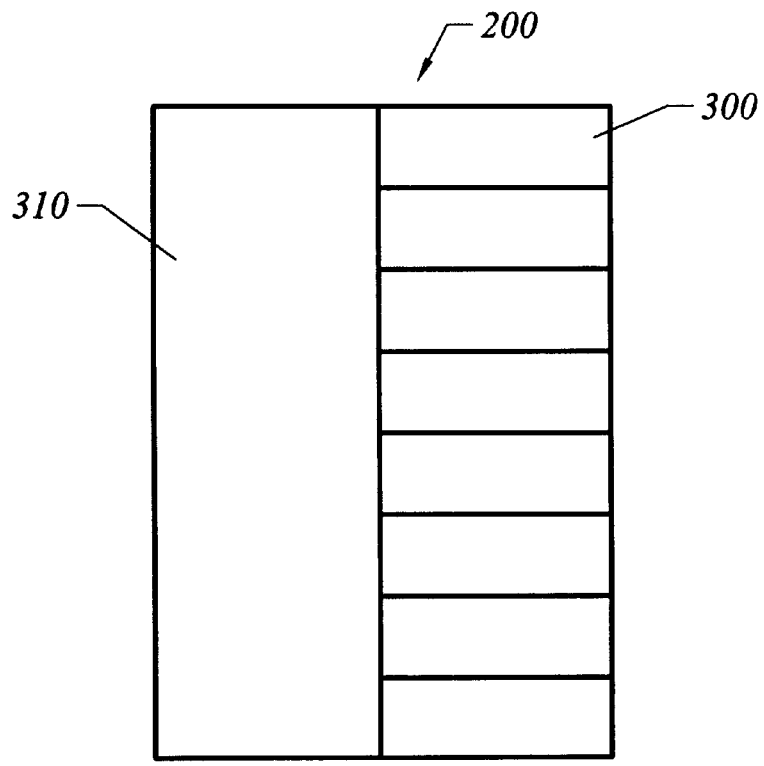
FIG. 3A is a simplified block diagram of a logic array block (LAB) of a programmable logic device.

FIG. 3A shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has common inputs, but separate outputs and control signals. In a specific embodiment of the present invention, LAB 200 has thirty-six LEs 300. In some embodiments, LAB 200 includes carry chains.

A general overview of a LAB 200 is presented here, sufficient to provide a basic understanding of LAB 200. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

In an embodiment, LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 3B:
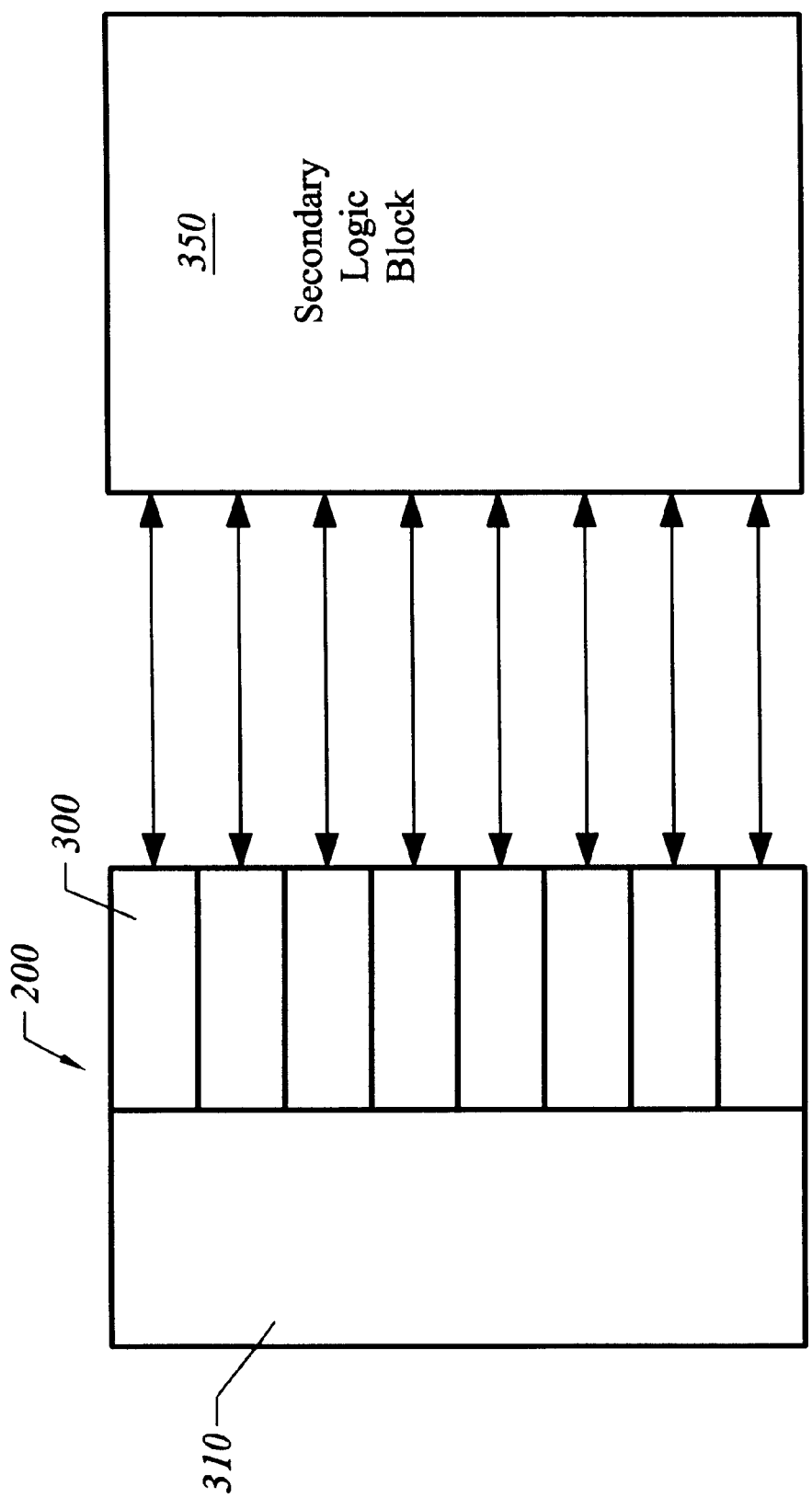
FIG. 3B shows a LAB interfacing with a secondary logic block.

FIG. 3B shows LAB 200 and LEs 300 interfacing with a secondary or auxiliary logic block 350. Secondary logic block 350 provides additional functionality for LAB 200 and LEs 300. Secondary logic block 350 contains specialized logical functionality such as a memory, an arithmetic accelerator, a wide multiplexer, or a other similar logic components, and combinations of these. Data is passed to and from LEs 300 of LAB 200 and secondary logic block 350. For example, signals and data may be passed to secondary logic block 350, processed by secondary logic block 350, and then the results returned to LAB 200 and LEs 300. PLD 121 may contain multiple secondary logic blocks 350, all of which need not provide the same logic function. For example, one secondary logic block 350 may be an arithmetic accelerator while another is a memory.

As shown in the embodiment of FIG. 3B, multiple LEs 300 within LAB 200 may be programmably coupled to one secondary logic block 350. In further embodiments, there many be any number of LEs 300 or LABs 200 programmably coupled to secondary logic block 350. For example, there may be one secondary logic block 350 for one LE 300 or one secondary logic block 350 shared by a plurality of LABs 200. Also, only a portion of the LEs 300 of LAB 200 may be programmable coupled to one secondary logic block 350, while the others are coupled to another.

Figure 4:
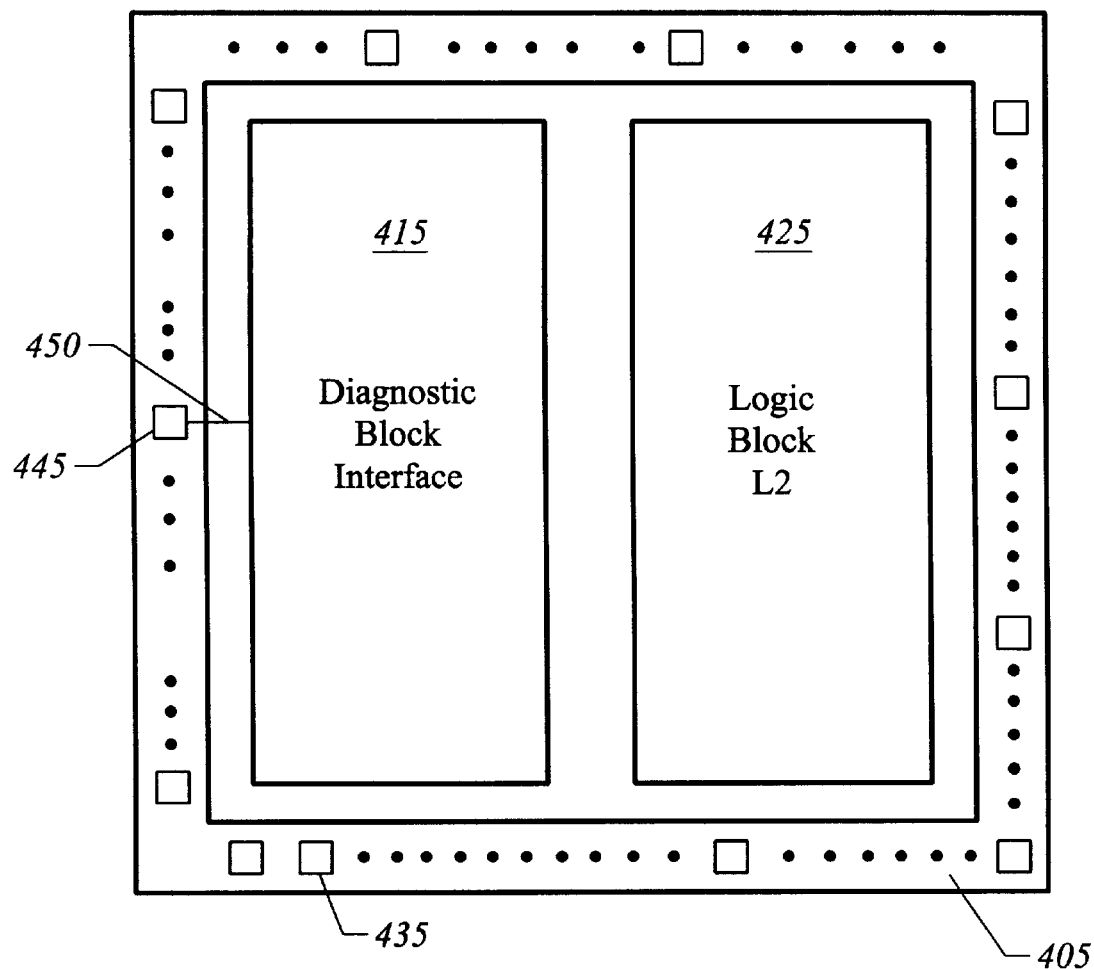
FIG. 4 shows a block diagram of an architecture of the present invention.

FIG. 4 shows a block diagram of a programmable logic architecture of the present invention. This programmable logic architecture may be used as a complete PLD integrated circuit or features of this architecture may be incorporated within the PLD architecture shown in FIG. 2. Furthermore, this architecture may be embedded or used, within or in conjunction with, other integrated circuits such as memories, ASICs, and computing and information processors. This architecture features flexibility and richness of routing.

The programmable logic device architecture comprises a pad ring 405, a diagnostic interface 415, and a logic block L2 425. Pad ring 405 includes a number of pad blocks 435. Pad blocks 435 may be similar to input-output drivers 230 described above. Each pad block 435 is programmably configurable for use as an input driver, output driver, or bidirectional driver. An input driver buffers a signal received on an external pin and drives this signal onto one of the conductors inside the integrated circuit; then, this signal may be coupled to the desired internal circuits and LABs 200. An output driver buffers a signal received on an internal conductor to drive the signal out onto the external pin of the device. This makes the signal available to the "outside world."

An output driver may have additional characteristics. Among these are "tristate," "open drain," and "open source" features. A tristateable output driver may be enabled and disabled by a control signal. When enabled, a tristate output driver drives a data signal onto the external pin with a low impedance. When disabled, this output buffer does not drive the data signal out to the external pin, but the output buffer assumes a high-impedance state. In the high-impedance state, the tristate output driver has no effect on the signal level of the external pin. A tristateable output buffer may be used for a bidirectional input-output bus. An open-drain output driver behaves as follows: When the input data is a logic high, the output buffer assumes a high impedance state. When the input data input is a logic low, the output buffer drives out a logic low at low impedance. An open-source output driver behaves similarly: When the input data is a logic high, the buffer drives the external pin to a logic high at low impedance. When the input data is a logic low, the buffer assumes a high-impedance state.

An external pin may be coupled to both an input buffer and an output buffer. This type of pin is sometimes referred to as an input-output (or I/O) pin. In other embodiments of the present invention, a PLD may have dedicated input drivers and dedicated output driver, as well as special "fast" input drivers and the like. Moreover, pad block 435 may include a bonding pad, input-output registers, and control and data selectors (or multiplexers). Pad blocks 435 may be programmably coupled to diagnostic block interface 415 or logic block L2 425, or both. Pad ring 405 may also contain pad blocks 445 specifically associated with and coupled to diagnostic interface block 415. For example, diagnostic interface block 415 may be directly coupled (via line 450) to pad blocks 445. This may similarly be the case for the pad ring and logic block L2 425.

In a specific embodiment of pad ring 405, there are approximately 512 pad blocks 435. Pad blocks 435 may be bidirectional-type circuits, as discussed earlier. Moreover, pad blocks 435 may interface via a bonding pad, a wire, and a lead frame to an external pin of an integrated circuit package.

Diagnostic interface block 415 may perform JTAG functions, configure the programmable elements in the device, handle logic state initialization and read back, reports error conditions, and provide special functions for manufacturing test enhancement, as well as other types of functions. JTAG functions include those specified in IEEE Standard 1149.1 (1149.1a), which is described in *IEEE Standard Test Access Port and Boundary-Scan Architecture*, which is incorporated by reference herein for all purposes.

Figure 5:
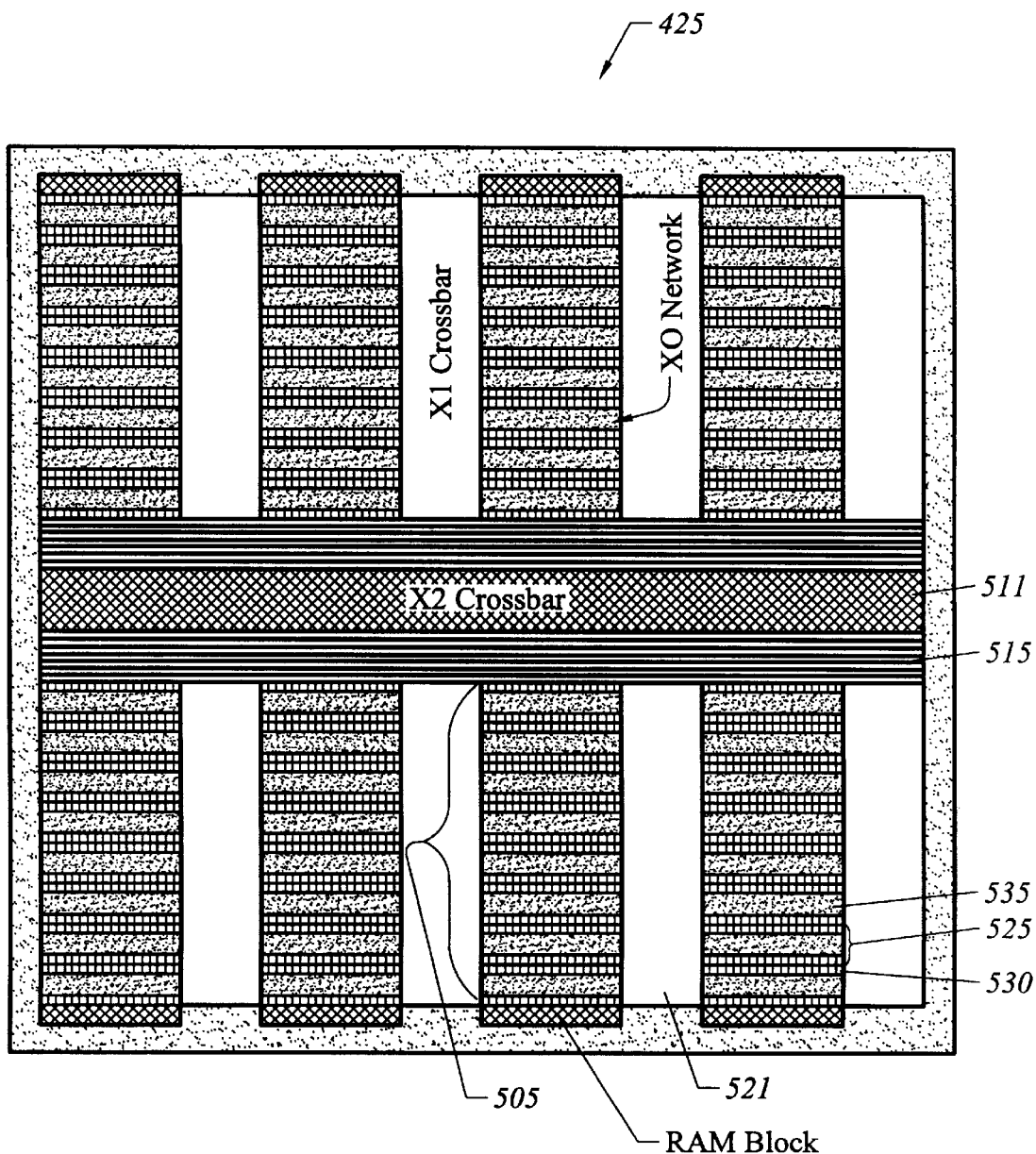
FIG. 5 is a block diagram of a L2 logic block.

FIG. 5 shows a more detailed block diagram of logic block L2 425. Logic block L2 425 contains programmable logic blocks, elements, and interconnect for performing logical functions. Logic block L2 425 includes a plurality of logic blocks L1 505, an X2 programmable interconnect network 510, and interconnect 515 for programmably coupling X2 programmable interconnect network 510 to pad ring 405 and logic blocks L1 505. Interconnect 515 between pad ring 405, X2 programmable interconnect network 511, and logic blocks L1 505 consists of conductors with two end pins and may not have fan-in or fan-out. These may be referred to as "two-point wires." X2 interconnect network 511 may be formed using programmable interconnect, crossbars, multiplexers, and the like, and combinations of these. In a specific embodiment, X2 interconnect network 511 is implemented using partial crossbars or crossbars.

Figure 6:
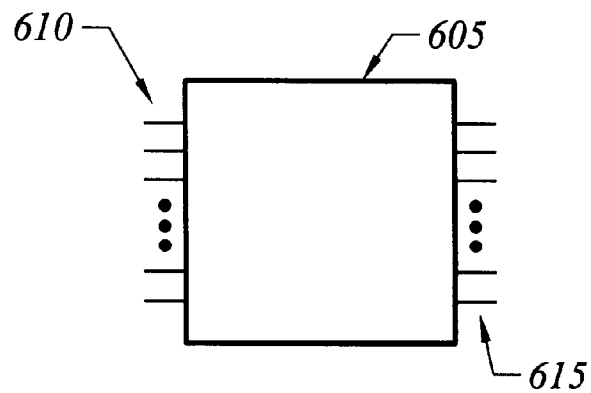
FIG. 6 is a diagram of a crossbar circuit.

FIG. 6 shows a block diagram of a typical crossbar circuit 605. Typically, a crossbar circuit 605 is a programmable interconnect resource used to programmably couple signals and programmable elements to other components of the integrated circuit. A more detailed description of a specific embodiment of a crossbar structure is provided below in connection with FIG. 10. Generally, crossbar circuit 605 has a plurality of pins 610 and pins 615. As an example, a typical crossbar circuit may have forty-eight pins (a combination of pins 610 and pins 615). Pins may be apportioned as pins 610 and pins 615 in any manner. For example, in a specific embodiment, there may be thirty-two pins 610 and sixteen pins 615.

Each of pins 610 and 615 may be configured as an input pin or output pin. For example, a pin 610 may be programmably configured as an input pin and programmably coupled to one or more pins 615, configured as output pins. Moreover, crossbar circuit 605 may also contain dedicated input pins and dedicated output pins. Crossbar circuit 605 may also provide buffered configurable directional connections from an input pin to one or more output pins. For example, a signal coupled to an input pin may be buffered to an output pin. Using a buffered path, data may be transferred in an input pin-to-output pin direction, but not necessarily in the reverse direction. Also, buffering allows signals to be driven onto longer conductors and with improved propagation speed. The direction may or may not be dynamically configured based upon the configuration of the pins. Moreover, some pins 610 and 615 may be associated with a particular buffer for transferring data in a specific direction.

In one embodiment of the present invention, the partial crossbar interconnect architecture is used. Some specific embodiments of this architecture are described in U.S. Pat. Nos. 5,036,473, 5,448,496, and 5,452,231, all incorporated herein by reference. In a partial crossbar interconnect architecture, the pins of each crossbar are connected to the same subset of pins of every logic block. For example, from a logic block L1, there would be four parallel connections to a particular X2 crossbar 510. This would allow four signals from logic block L1 to be coupled to that particular X2 crossbar 510.

In the particular embodiment of the present invention shown in FIG. 5, there are eight logic blocks L1 505 and sixty-four X2 crossbars 510, although an architecture of the present invention may be designed having various numbers of logic blocks and crossbars. Logic blocks L1 505 may be programmably coupled together using an X1 programmable interconnect network 521. X1 interconnect network 521 is analogous to, and may be similar to, X2 programmable interconnect network 511. In a specific embodiment, X1 interconnect network 521 may be implemented using partial crossbars or crossbars, and combinations of these, as well as many other interconnect resources. X1 interconnect network 521 may be used to programmably coupled signals between the logic blocks. For example, signals from one logic block L1 505 may be programmably coupled to other logic blocks L1 505.

Logic blocks L1 505 may be programmably coupled to X2 interconnect network 511. For example, signals from logic blocks L1 505 may be programmably coupled through X1 interconnect network 521 to X2 interconnect network 511 to interconnect 515 to pad blocks 435.

Logic blocks L1 505 are comprised of a plurality of logic blocks L0 525. In the embodiment in FIG. 5, there are eight logic blocks L0 525 in a logic block L1 505, although logic L1 505 may contain any number of logic blocks L0 525. Logic blocks L0 525 may be analogous to LABs 200. Logic blocks L0 525 may contain a plurality of LEs 530, which may be programmably coupled using an X0 programmable interconnect network 535. X0 programmable interconnect network 535 may be analogous to X1 programmable interconnect network 520 and local interconnect structure 310. Logic block L0 525 will be described further below.

Figure 7:
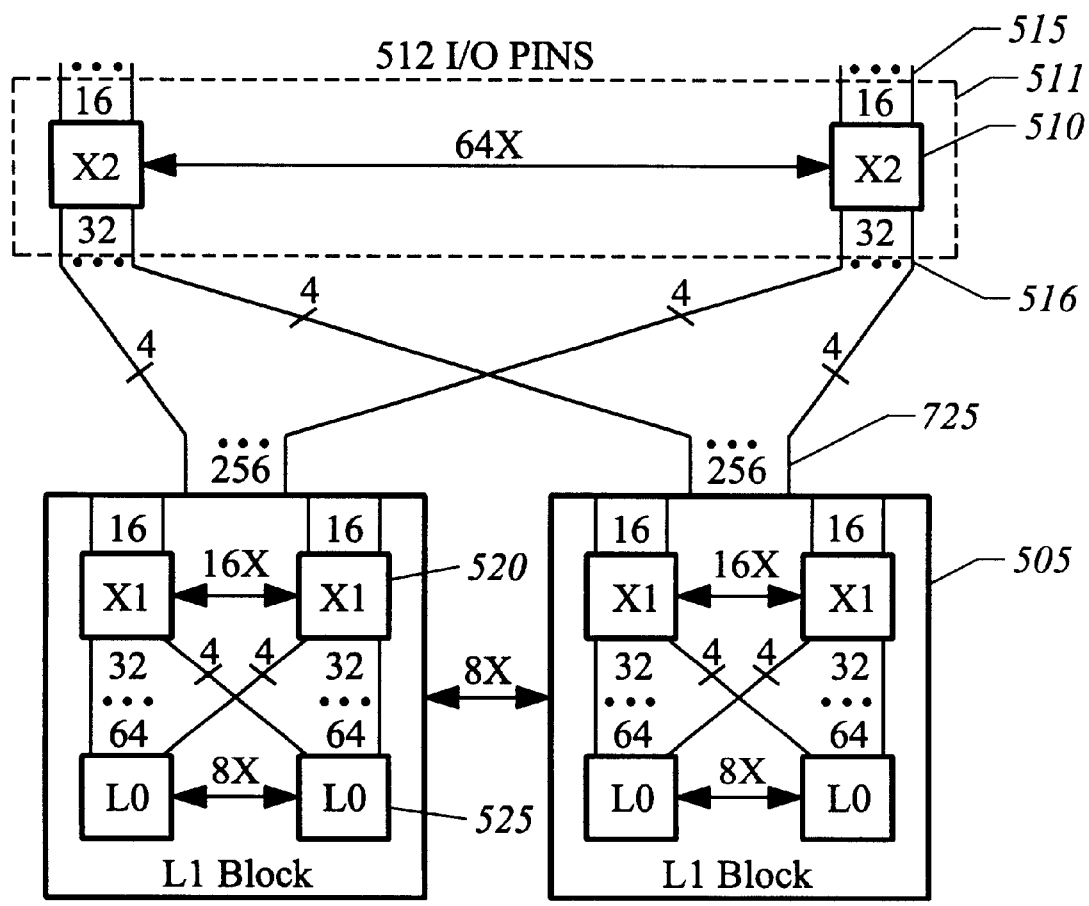
FIG. 7 is a block diagram of the interface of L1 logic blocks through the X2 crossbars to the pad blocks.

FIG. 7 shows a more detailed block diagram of X2 interconnect network 511 and L1 logic blocks 505. X2 interconnect network 511 includes a plurality of X2 programmable interconnect blocks 510. In a specific embodiment, X2 interconnect network 511 is a partial crossbar interconnect network. L1 logic blocks 505 may be programmably coupled through the plurality of X2 programmable interconnect blocks 510 and interconnect 515 to pad blocks 435 (or other components of the integrated circuit). For example, the plurality of X2 programmable interconnect blocks 510 may be configured to programmably couple signals to and from L1 logic blocks 505 to pad blocks 435 and diagnostic block interface 415.

FIG. 7 shows a particular embodiment of the present invention. As shown, there are sixty-four X2 programmable interconnect blocks 510 and eight logic blocks L1 505. However, other embodiments of the present invention may include any number of these elements. X2 programmable interconnect block 510 has sixteen lines or pins 515 for coupling to pad blocks 435 and other components of the integrated circuit. Pins 515 may be referred to an "upper" pins. X2 programmable interconnect block 510 further comprises thirty-two "lower" pins 516 for coupling to eight logic blocks L1 505. X2 programmable interconnect block 510 may programmably couple signals between any of the thirty-two "lower" pins 516 to any of the sixteen "upper" pins 515, and vice versa. L1 logic block 505 has 256 signal lines or pins 725 for input and output. These signal Lines 725 are coupled "four-wires rich" to the X2 programmable interconnect block 510. This means, for example, that each logic block L1 505 may be coupled by four wires to each X2 programmable interconnect block 510. Accordingly, when there are sixty-four X2 programmable interconnect blocks 510, there would be 256 (i.e., 64*4) signal lines 725. A software routing program may specify and programmably configure signal lines 725 to interconnect L1 logic blocks 505 to the lower pins 516 of X2 programmable interconnect block 510 as desired. And, from X2 programmable interconnect block 510, the signals may be programmably routed to upper pins 515 as desired. X2 programmable interconnect block 510 may be configured to pass data from lower pins 516 to upper pins 515, and vice versa.

An X2 programmable interconnect block 510 may programmably couple a signal on a lower pin 516 from a logic block L1 505 to upper pin 515 (also known as a "two-point wire"). This signal may also be driven to a plurality of upper pins 515. This means that there may be no fan-out restrictions for lower pins 516 of X2 programmable interconnect block 510. Pins 516 may drive out to many pins 515 and vice versa. The fan-in of upper pin 515 of X2 programmable interconnect block 510 may be one (when no logic is performed). With the architecture and routing structure of the present invention, signals may be programmably routed and coupled to, and between, the many logic blocks and logic elements. A signal from an upper pin 515 may be programmably coupled and routed through X2 programmable interconnect block 510 to an X1 programmable interconnect block 520, within a logic block L1 505. Specifically, pad block 435 may be programmably coupled through an upper pin 515 through X2 programmable interconnect block 510 and a lower pin 516 through signal lines 725 to X1 programmable interconnect block 520.

FIG. 7 shows a particular interconnection pattern between X2 programmable interconnect blocks 510 and X1 programmable interconnect blocks 520 of logic blocks L1 505. The plurality of lower pins 516 is coupled in groups of four to each logic block L1 505 through signal lines 725. Moreover, from lines 725, signals may be programmably coupled to X1 programmable interconnect blocks 520. For example, one X2 block 510 may be coupled via four lower pins 516 to each of eight logic blocks L1 505. For a logic block L1 505, each signal line 725 from a particular X2 block 510 may be coupled to a different X1 interconnect block 520 within the logic block L1 505. For example, the four pins 516 from an X2 block 510 may be coupled to four different X1 blocks 520 within the same logic block L1 505. Programmable interconnect blocks 520 may also be coupled to X2 programmable interconnect blocks 510 using other patterns, where the particular interconnection pattern chosen may provide various advantages. For example, a particular interconnect pattern may be appropriately suited for debugging applications. Other patterns may be more generalized and useful for providing flexible and predictable routability.

Further, the interconnection pattern of the X2 and X1 interconnect networks to the logic blocks and to the pad blocks 435 impacts the efficiency of the routing of nets and the probability of success when using routing software. An important concept in designing an interconnection pattern is to ensure that the routing is uniform and maximally dispersed. "Maximally dispersed" means that for a given pair of "lower-level" interconnection blocks, they will couple directly to as many "higher-level" interconnection blocks as possible. For example, for a pair of X1 interconnection blocks 520 in different logic blocks L1 505, they should be coupled directly to as many X2 programmable interconnect blocks 510 as possible. If this is true for every pair of X1 programmable interconnect blocks 520 in the integrated circuit then the interconnection pattern is maximally dispersed. Other patterns may also be used to improve the routing efficiency of the architecture.

Figure 8:
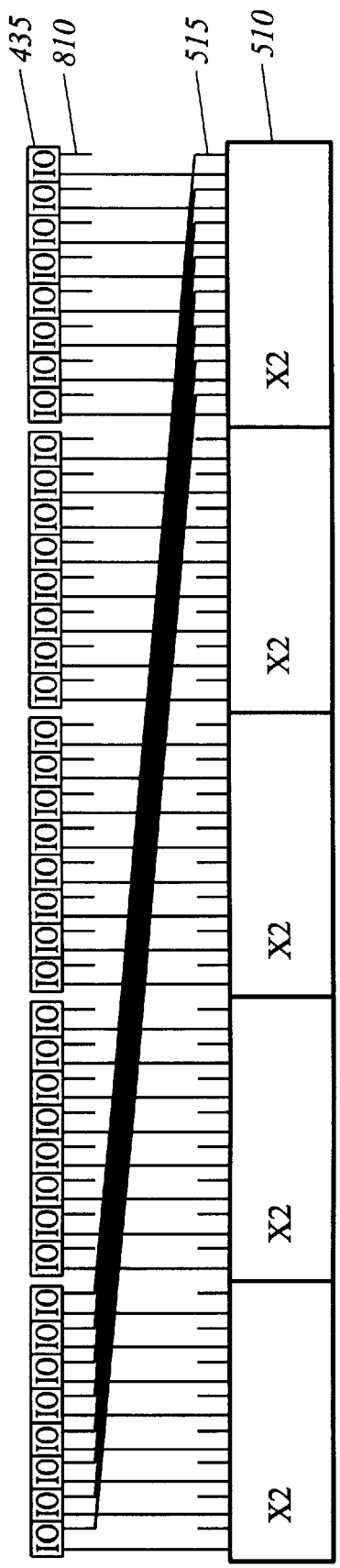
FIG. 8 is a diagram of the X2 crossbar interface to the pad blocks.

FIG. 8 shows a block diagram of the interface between X2 programmable interconnect network 510 and pad blocks 435. A plurality of X2 partial crossbar interconnect network 511 pins are coupled to pad blocks 435 of the pad ring 405. X2 partial crossbar interconnect network 511 and pad blocks 435 are interconnected according to the pattern shown. Please note that some of the interconnections between pad blocks 435 and X2 network blocks 510 are not shown in order to simplify the diagram. These interconnections would be similar to those already shown. In the pattern shown, a first data pin 810 of a pad block 435 is coupled to a first X2 block 510. A second data pin 810 is coupled to an upper pin 515 of a second X2 block 510, on an opposite side of the plurality of X2 blocks 510. This pattern continues symmetrically until all data pins 810 are connected to a X2 interconnect block 510. Other patterns may also be used, where the particular interconnection pattern chosen may provide various advantages as discussed earlier.

In the embodiment shown in FIG. 8, pad blocks 435 have data pins 810 for coupling to X2 programmable interconnect network blocks 510. In FIG. 8, each pad block 435 has two data pins 810 for coupling to X2 programmable interconnect network blocks 510. For example, in one embodiment, pad block 435 has a first data pin 810 for coupling to an X2 interconnect block 510 and a second data pin 810 for coupling to a different X2 interconnect block 510. From the X2 network 510, pad blocks 435 may be coupled to, for example, logic block L1 505. As discussed earlier, pad block 435 may be configured as an input or output for driving and receiving signals to and from the logic blocks and logic elements of the integrated circuit. Then, these two lines provide paths for routing.

Figure 9:
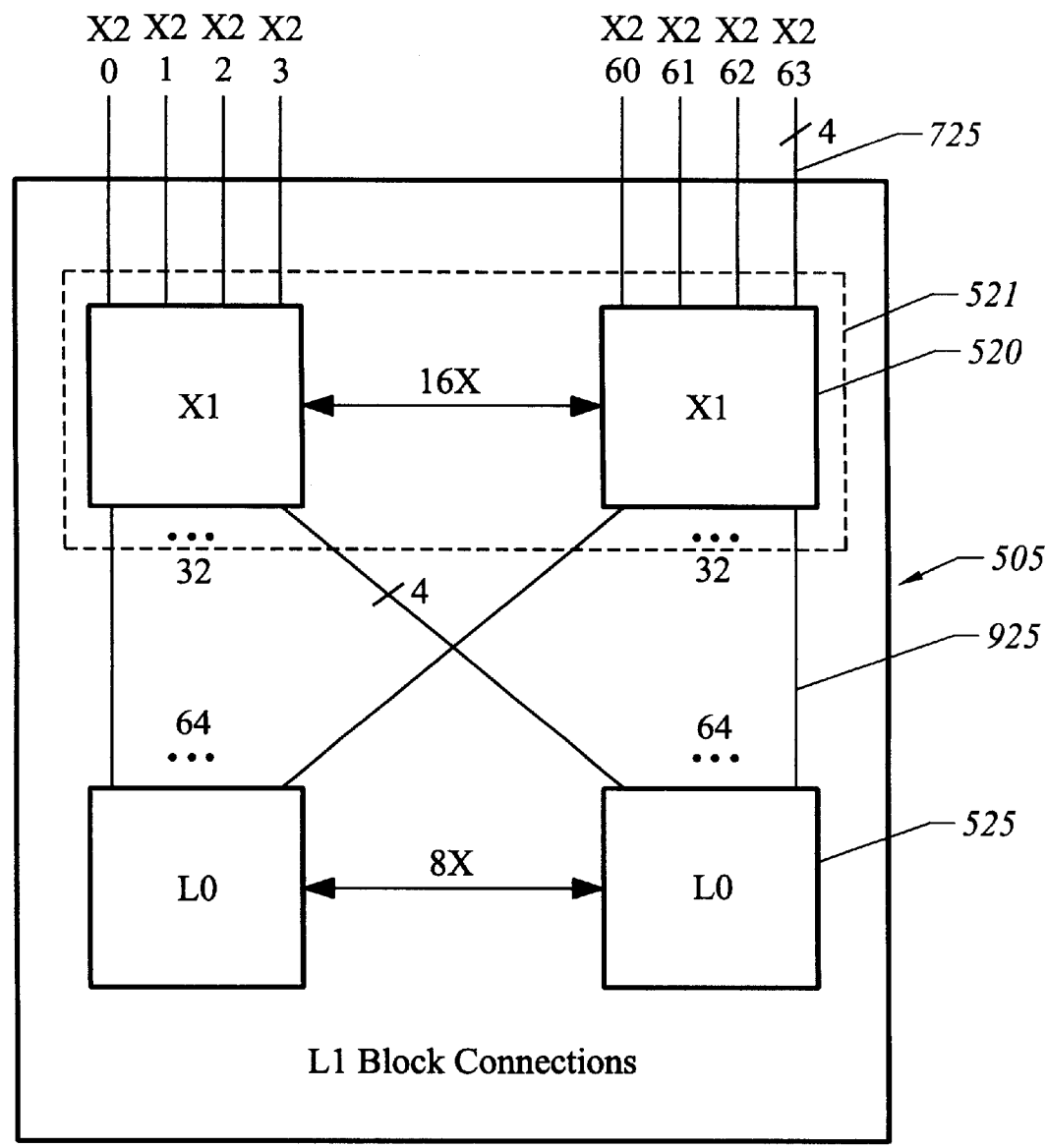
FIG. 9 is a more detailed block diagram of the L1 logic block.

FIG. 9 shows a block diagram of logic block L1 505. Logic block L1 505 includes a plurality of logic blocks L0 525 and a plurality of X1 programmable interconnect blocks 520. Logic blocks L0 525 may be programmably coupled through X1 programmable interconnect blocks 520 and lower pins 925 to X2 partial crossbar interconnect network 511. A more detailed description of logic blocks L0 525 is provided below.

A logic block L1 505 has a plurality of "upper" lines 725 (also shown in FIG. 7) which are coupled to X2 interconnect blocks 510. In one embodiment, there are four lines 725 from a logic block 505 coupled to each of sixty-four X2 programmable interconnect blocks 510, for a total of 256 lines 725. In the embodiment of FIG. 9, logic block L1 505 includes eight logic blocks L0 525 and sixteen X1 programmable interconnect blocks 520. Each logic block L0 525 is coupled to each X1 programmable interconnect block 520 using four lines 925. This is analogous to the interconnection pattern described above between the X2 interconnect block 510 and logic blocks L1 505 in FIG. 7.

An X1 programmable interconnect block 520 has a plurality of upper pins 725 and lower pins 925. In FIG. 9, a X1 programmable interconnect block 520 has forty-eight pins total, sixteen upper pins 725 and thirty-two lower pins 925. X1 interconnect block 520 may be implemented using many different types of interconnect structures, such as programmable multiplexers, programmable AND, programmable NOR, global interconnect, and many others, including those which have been described above. In a preferred embodiment, X1 block 520 is implemented using a crossbar circuit. Then, for example, each pin may be configured as an input or an output. An input pin of an X1 crossbar 520 has no fanout restrictions and may drive as many output pins of the X1 crossbar 520 as desired. The fan-in of an X1 crossbar 520 output pin may be one in the case when no interconnect logic is performed. From an input pin, signals may be routed within the X2 crossbar 520 to any of the output pins.

Furthermore, to provide for the efficient routing of nets, the interconnection pattern for logic blocks L0 525 to X1 programmable interconnect blocks 520 within a logic block L1 505 should also be uniform and maximally dispersed, as described earlier.

Figure 10:
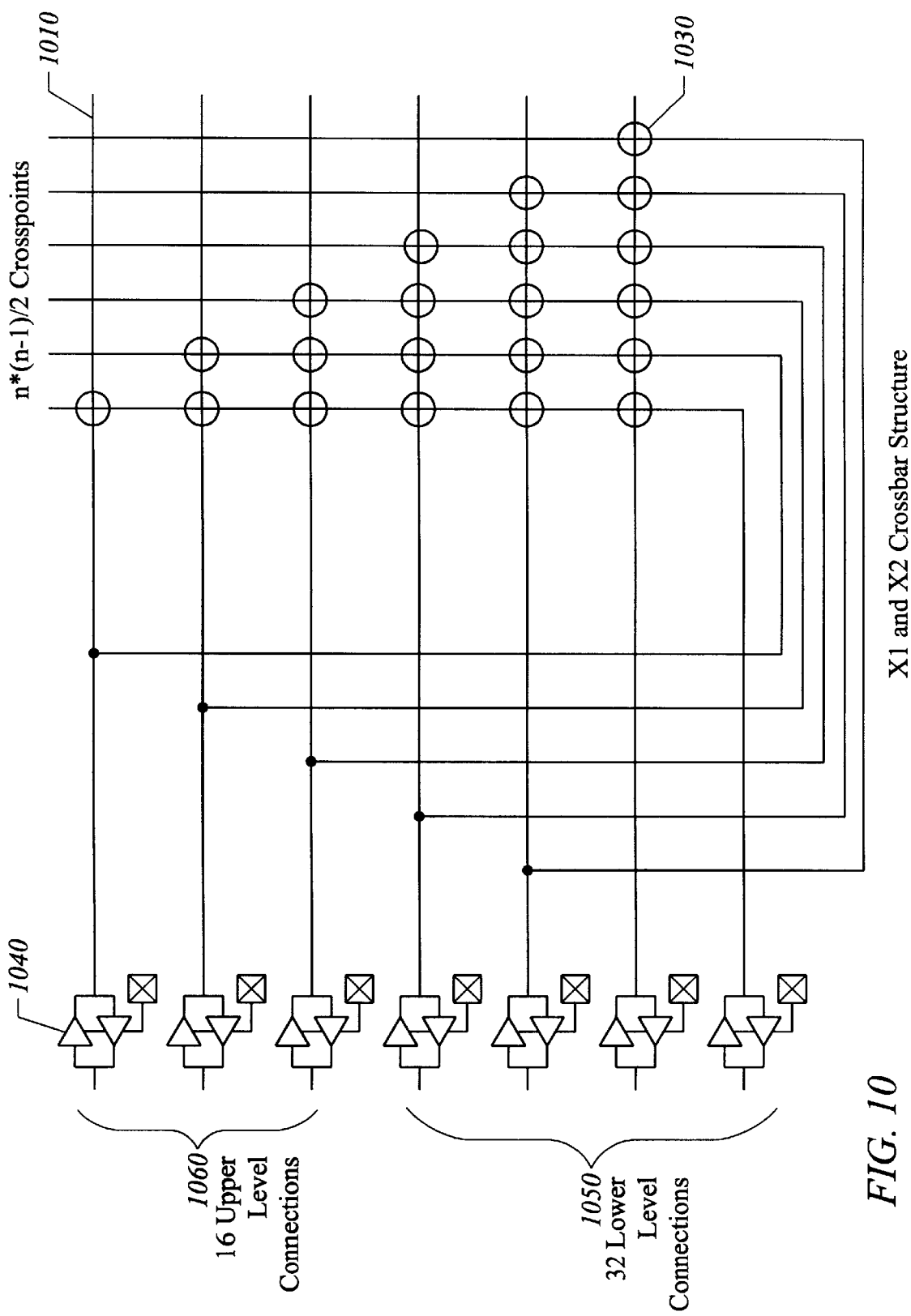
FIG. 10 is a diagram of the X1 and X2 crossbar structure.

FIG. 10 shows a more detailed diagram of a specific programmable interconnect structure which may be used to implement X1 partial crossbar interconnect network 521 and X2 partial crossbar interconnect network 511. More specifically, FIG. 10 shows an embodiment of a crossbar structure for a programmable interconnect network. A plurality of lines 1010 intersect at programmable intersections (or crosspoints) 1030 with other lines in the plurality of lines 1010. At programmable intersections 1030, lines 1010 may be programmably coupled to another line 1010, or other lines 1010. Lines 1010 are coupled to programmable directional buffers 1040. For example, signals in a lower portion 1050 of the programmable interconnect structure may be programmably coupled through programmable intersections 1030 to lines in an upper portion 1060 of the structure. Lower portion 1050 may be analogous to the lower pins of the X2 and X1 interconnect networks; and upper portion 1060 may be analogous to the upper pins of the X2 and X1 interconnect networks. Signals are input or output through programmable directional buffers 1040.

Any connections 1050 and 1060 can be routed to any other of these connections at a crossbar, as one skilled in the art will readily perceive. Directional buffers 1040 have two possible states. If a connection 1050 or 1060 is an input to a crosspoint 1030, then buffer 1040 is programmably configured to detect a signal incoming on connection 1050 or 1060. Buffer 1040 buffers the incoming signal, providing faster, cleaner edges onto a crossbar via a line 1010. In the case when connection 1050 or 1060 is an output of the crossbar, buffer 1040 is configured to detect a signal on line 1010 and to buffer the signal onto line 1050 or 1060, providing faster, cleaner edges. As an example, in a specific embodiment of the present invention, X1 partial crossbar interconnect network 521 (see FIG. 9) is implemented using the crossbar structure shown in FIG. 10. Specifically, for each X1 interconnect block 520 in a logic block L1 505, thirty-two lower-level connections 1050 (i.e., analogous to lines 925) are coupled four wires rich to eight L0 logic blocks. For each X1 interconnect block 520 in a logic block L1 505, there are sixteen upper-level connections 1060 (i.e., analogous to lines 725). Since there are eight X1 interconnect blocks 520 in a logic block L1 505, a logic block L1 505 has 256 upperlevel connections 1060 for coupling to the X2 interconnect block 510 (see FIG. 7).

Moreover, in a specific embodiment, X2 partial crossbar interconnect network 511 (see FIG. 7) is also similarly implemented using a crossbar structure as shown in FIG. 10. Specifically, lower-level connections 1050 (i.e., analogous to lines 725) couple to logic blocks L1 505 and upper-level connections 1060 (i.e., analogous to lines 515) couple to pad blocks 435.

Figure 11:
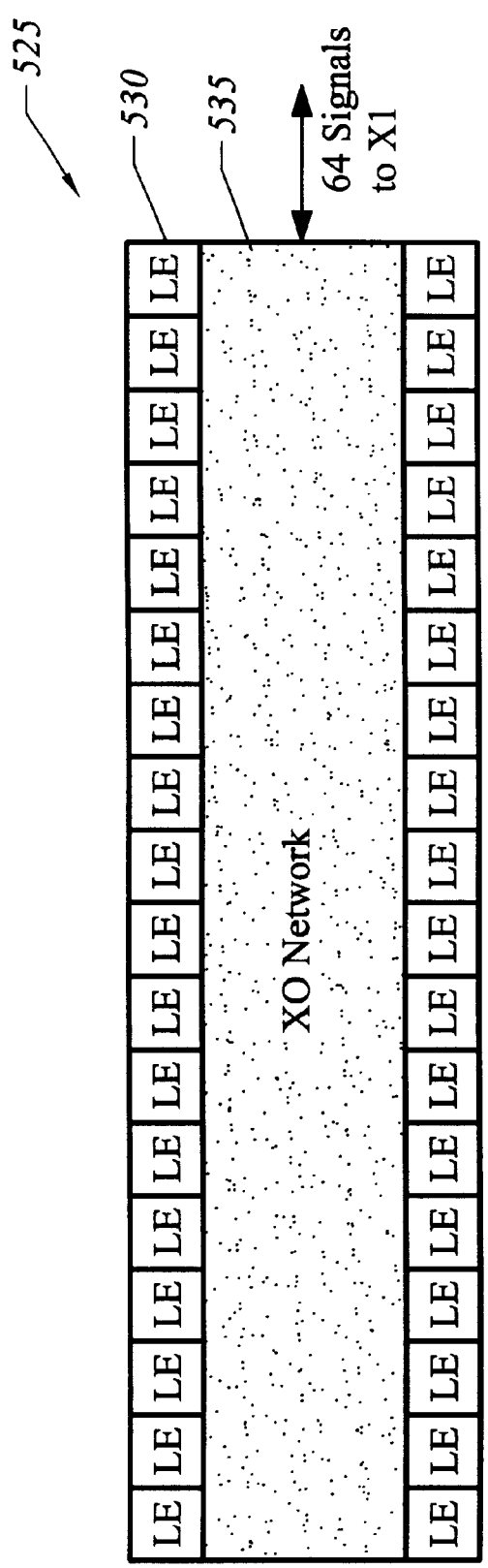
FIG. 11 is a block diagram of the L0 logic block.

FIG. 11 shows a block diagram of a logic block L0 525. Logic block L0 525 includes a plurality of LEs 530 (analogous to LEs 300 of FIG. 3), X0 programmable interconnect network 535, and optionally a secondary function block 350 (not shown). In FIG. 11, logic block L0 535 has thirty-six LEs 530. In other embodiments, logic block L0 535 may have any number of LEs 530. X0 programmable interconnect network 535 is a programmable interconnect for programmably coupling LEs 530 within a logic block L0 535, somewhat similar to a local interconnect in a LAB. X0 network 535 may be implemented using many schemes including, among others, programmable AND-OR logic, programmable multiplexers, programmable crossbars, programmable interconnect such a global lines, and many others. X0 programmable interconnect network 535 is also used to programmably couple LEs 530 to X1 partial crossbar interconnect network 521. Moreover, in an embodiment, logic block L0 525 has a secondary function block 350. X0 programmable network 535 may be used to programmably couple LEs 530 to the secondary function block 350.

As can be appreciated, the architecture of the present invention provides a great deal of flexibility in the routing and interconnection of the logical components. Within a logic block L0 525, LEs 350 may be interconnected together using X0 interconnect network 535. LEs 350 may be programmably coupled through X0 interconnect network 535 to X1 interconnect blocks 520. From X1 interconnect blocks 535, LEs 350 may be programmably coupled to LEs 530 in other logic blocks L0 525, within the same logic block L1 505. Also, from X1 interconnect blocks 520, LEs 530 may also be programmably coupled to X2 interconnect blocks 510; then, LEs 530 may be programmably coupled to LEs 530 in different logic blocks L1 505. The programmable interconnect blocks, X1 and X2 provide richness in routability. In further embodiments of the present invention, additional "levels" of programmable interconnect blocks may be used for interconnecting even larger logic blocks, For example, an additional level of programmable interconnect blocks (similar to X1 and X2 interconnect blocks) may be used for interconnecting a plurality of logic blocks L2 425, and a plurality of X2 interconnect blocks 510. In a similar manner, the architecture of the present invention may be extended indefinitely.

The richness of routability allows LEs 530 to be easily interconnected. The many various interconnect paths allows LEs 530 to be interconnected using one or more paths, especially when the interconnect structure is heavily utilized. For example, the shortest interconnect path between two LEs 530 may already be used; however, these LEs 530 may still be interconnected using another path by passing signals through X1 and X2 interconnect blocks as needed. In fact, one such interconnection path may pass through many X1 and X2 interconnect blocks, possibly iterating back and forth many times between the X1 and X2 blocks. The flexibility of the present invention helps to ensure the routability of a logic function, regardless of the complexity. The present invention also has a regular, and uniform interconnect structure. Each of the levels of interconnect is similar to the other levels. For example, the interconnect structure for programmably coupling logic blocks L1 505 is similar to the structure used for logic blocks L0 520. This feature allows more predictable routability of the components, thus enhancing the ease with which functions may be implemented, especially when using automated means (such as by the computer). However, in other embodiments of the present invention, the interconnect structure may be less uniform and regular depending on the application. For example, the present invention may include a plurality of secondary logic blocks 350, each of which performs a different specialized function. Furthermore, some logic blocks in a particular logic block level, such as logic block L1 505, may be substituted with a programmable logic device architecture as shown in FIG. 2. In this fashion, the architecture of the present invention may be used to implement functions programmed into a plurality of programmable logic devices such as shown in FIG. 2.

Software to program programmable logic is well known to those skilled in the art and is available in various embodiments from Altera Corporation and others producing FPGAs. The programmable logic architecture of the present invention may also be configured using software running on a programmed digital machine, such as a computer. In particular, to software rout the X1 and X2 programmable interconnect networks, the X1 and X2 programmable networks 510 may be treated as fully buffered output crossbars. The X1 and X2 programmable interconnect networks may be used for "ping-pong" routing, where a signal may be routed from one interconnect block through a plurality of interconnect blocks to its final destination. Furthermore, in certain cases, so many nets may need to be routed from adjacent pins programmably coupled through an X2 programmable interconnect block 510 to a logic block L1 505 that there are not enough pins and direct connections. In this case, in order to make the necessary connections, the router software may route the nets through unused pins of an X1 programmable interconnect block 520 and feed these back through another X2 programmable interconnect block 510 which has unused pins.

X1 programmable interconnect block 520 may be used to route signals between logic blocks L0 525 to other logic blocks L0 525 within a logic block L1 505. A combination of routing from the X1 network to the X2 network and back to the X1 network may be used to route signals from one logic block L0 to another logic block L0, when the logic blocks L0 are in different logic blocks L1. X2 programmable interconnect block 510 may be used to route signals from logic blocks L0 525 to other logic blocks L0 525 in different logic blocks L1 505.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A programmable logic device comprising:
   a plurality of first programmable interconnect blocks;
   a plurality of first logic blocks, programmably coupled to said plurality of first programmable interconnect blocks, wherein a first logic block comprises:
      a plurality of second logic blocks;
      a plurality of second programmable interconnect blocks, programmably coupled to said plurality of second logic blocks and said plurality of first programmable interconnect blocks; and
      at least one secondary function block, each of said at least one secondary function block programmably coupled to at least a subset of said plurality of second logic blocks; and
   a diagnostic interface block for implementing diagnostic and prototyping features, programmably coupled to said plurality of first programmable interconnect blocks.

2. The programmable logic device of claim 1 further comprising:
   a plurality of pad blocks for providing input and output, wherein said plurality of first programmable interconnect blocks programmably couples said plurality of first logic blocks to said pad blocks.

3. The programmable logic device of claim 1 wherein said first programmable interconnect blocks are programmable crossbar circuits.

4. A system comprising a programmable logic device as recited in claim 1.

5. The programmable logic device of claim 1 wherein said at least one secondary function block contains a specialized function.

6. The programmable logic device of claim 5 wherein said specialized function is a memory function.

7. The programmable logic device of claim 5 wherein said specialized function is an arithmetic accelerator.

8. The programmable logic device of claim 5 wherein said specialized function is a multiplexer.

9. A programmable logic device comprising:
   a plurality of pad blocks for providing input and output to said programmable logic device;
   a diagnostic block interface providing diagnostic and test features; and
   a first programmable logic block for performing logic functions comprising:
      a plurality of second programmable logic blocks for performing logic functions, said plurality of second programmable logic blocks comprised of a plurality of reprogrammable logic elements, programmable interconnect for interconnecting said plurality of reprogrammable logic elements and at least one secondary function block, each of said at least one secondary function block programmably coupled to at least a subset of said plurality of reprogrammable logic elements; and
      a plurality of first programmable interconnect blocks programmably coupled to said plurality of second programmable logic blocks, said plurality of pad blocks, and said diagnostic block interface.

10. The programmable logic device of claim 9 wherein said second programmable logic block comprises:
    a plurality of third programmable logic blocks for performing logic functions; and
    a plurality of second programmable interconnect blocks programmably coupled to said plurality of second logic blocks.

11. The programmable logic device of claim 10 wherein said plurality of third programmable logic blocks are programmably coupled through said plurality of second programmable interconnect blocks to said plurality of first programmable interconnect blocks.

12. The programmable logic device of claim 9 wherein said at least one secondary function block contains a specialized function.

13. The programmable logic device of claim 12 wherein said specialized function is a memory function.

14. The programmable logic device of claim 12 wherein said specialized function is an arithmetic accelerator.

15. The programmable logic device of claim 12 wherein said specialized function is a multiplexer.

16. An integrated circuit comprising:
    a first programmable crossbar comprising a plurality of pins, wherein each of said plurality of pins may be programmably coupled to every other pin of said plurality of pins
    a plurality of first logic blocks coupled to said plurality of pins of said first programmable crossbar, wherein said first programmable crossbar programmably couples signals from one of said plurality of first logic blocks to others of said plurality of first logic blocks, at least one of said plurality of first logic blocks comprising:
       a second programmable crossbar comprising a plurality of pins, wherein each of said plurality of pins may be programmable coupled to every other pin of said plurality of pins; and
       a plurality of second logic blocks coupled to said plurality of pins of said first programmable crossbar, wherein said second programmable crossbar programmably couple signals from one of said plurality of second logic blocks to others of said plurality of second logic blocks, and between said plurality of second logic blocks and said first programmable crossbar;
       at least one secondary function block each of said at least one secondary function block programmably coupled to at least a subset of said plurality of programmable logic elements; and
    a diagnostic interface block to facilitate diagnostic and test functionality coupled to said plurality of first logic blocks.

17. The integrated circuit of claim 16 further comprising:
    a plurality of pad blocks, wherein said first programmable crossbar programmably couples signals between said plurality of first logic blocks and said plurality of pad blocks.

18. The integrated circuit of claim 16 wherein the first programmable crossbar comprises:
    a plurality of conductors, each intersecting others of said plurality of conductors at programmable crosspoints, wherein one of said plurality of conductors may be programmably coupled to another of said plurality of conductors using a programmable crosspoint; and a plurality of programmable bidirectional buffers configured to pass signals between said plurality of pins and said plurality of conductors.

19. A system comprising an integrated circuit as recited in claim 16.

20. An integrated circuit comprising:
a first programmable crossbar comprising a plurality of upper pins and lower pins, wherein each of said upper pins may be programmably coupled using programmable crosspoints to each of said lower pins, and the first programmable crossbar comprises at most n×(n−1)/2 programmable crosspoints, where n is a sum of upper and lower pins;
a plurality of first logic blocks coupled to said plurality of pins of said first programmable crossbar, wherein said first programmable crossbar programmably couples signals from one of said plurality of first logic blocks to others of said plurality of first logic blocks; and
a diagnostic interface block to facilitate diagnostic and test functionality, coupled to said plurality of first logic blocks.

21. The integrated circuit of claim 20 wherein a first logic block comprises:
a second programmable crossbar comprising a plurality of pins, wherein each of said plurality of pins may be programmable coupled to every other pin of said plurality of pins; and
a plurality of second logic blocks coupled to said plurality of pins of said second programmable crossbar, wherein said second programmable crossbar programmably couple signals from one of said plurality of second logic blocks to others of said plurality of second logic blocks, and between said plurality of second logic blocks and said first programmable crossbar.

22. The integrated circuit of claim 20 further comprising:
a plurality of pad blocks, wherein said first programmable crossbar programmably couples signals between said plurality of first logic blocks and said plurality of pad blocks.

23. The integrated circuit of claim 20 wherein the first programmable crossbar comprises:
a plurality of conductors, each intersecting others of said plurality of conductors at programmable crosspoints, wherein one of said plurality of conductors may be programmably coupled to another of said plurality of conductors using a programmable crosspoint; and
a plurality of programmable bidirectional buffers configured to pass signals between said plurality of pins and said plurality of conductors.

24. A programmable logic integrated circuit comprising:
a plurality of input/output pads;
a plurality of first programmable interconnect blocks coupled to the input/output pads; and
a plurality of first logic blocks, each of the first programmable interconnect blocks coupled to each of the first logic blocks, wherein signals between the first logic blocks are programmably routed using the first programmable interconnect blocks, wherein there are X first logic blocks, 8X first programmable interconnect blocks, and 4 conductors between each first programmable interconnect block and first logic block, and X is an integer, and a first logic block comprises:
a plurality of second programmable interconnect blocks; and
a plurality of second logic blocks, each of the second programmable interconnect blocks coupled to each of the second logic blocks, wherein signals between the second logic blocks are programmably routed using the second programmable interconnect blocks.

25. The programmable logic integrated circuit of claim 24 wherein each first logic block has 32X conductors coupled to the first programmable interconnect blocks.

26. The programmable logic integrated circuit of claim 24 wherein each second logic block comprises 2X second programmable interconnect blocks and X second logic blocks.

27. The programmable logic integrated circuit of claim 26 wherein X is 32.

28. The programmable logic integrated circuit of claim 24 wherein each second logic block is coupled by 4 conductors to each second programmable interconnect block.

29. The programmable logic integrated circuit of claim 24 wherein X is 8.

30. The programmable logic integrated circuit of claim 24 wherein the plurality of first programmable interconnect blocks are provided in a center section of the integrated circuit, a first half of the first logic blocks are provided on a first side of the center block and a second half of the first logic blocks are on a second side of the center block, and between each of the first logic blocks is a section of second programmable interconnect blocks.

31. The programmable logic integrated circuit of claim 24 wherein each first programmable interconnect block has 4X conductors coupled to the first logic block.

32. The programmable logic integrated circuit of claim 31 wherein each second logic block has 8X conductors to the second interconnect blocks.

33. The programmable logic integrated circuit of claim 31 wherein each second programmable interconnect block has 4X conductors to the second logic blocks.

34. A programmable logic integrated circuit comprising:
a plurality of input/output pads;
a plurality of first programmable interconnect blocks coupled to the input/output pads; and
a plurality of first logic blocks, each of the first programmable interconnect blocks coupled to each of the first logic blocks, wherein signals between the first logic blocks are programmably routed using the first programmable interconnect blocks, each of the first programmable interconnect blocks provides X upper level connections and 2X lower level connections, wherein X is an integer, and a first logic block comprises:
a plurality of second programmable interconnect blocks; and
a plurality of second logic blocks, each of the second programmable interconnect blocks coupled to each of the second logic blocks, wherein signals between the second logic blocks are programmably routed using the second programmable interconnect blocks.

35. The programmable logic integrated circuit of claim 34 wherein X is 16.

36. A programmable logic integrated circuit comprising:
a plurality of input/output pads;
a plurality of first programmable interconnect blocks coupled to the input/output pads; and
a plurality of first logic blocks, each of the first programmable interconnect blocks coupled to each of the first logic blocks, wherein signals between the first logic blocks are programmably routed using the first programmable interconnect blocks, and a first logic block comprises:

a plurality of second programmable interconnect blocks; and a plurality of second logic blocks, each of the second programmable interconnect blocks coupled to each of the second logic blocks, wherein signals between the second logic blocks are programmably routed using the second programmable interconnect blocks, and each of the second programmable interconnect blocks provides X upper level connections and 2X lower level connections, wherein X is an integer.

37. A programmable logic device comprising:

a plurality of first programmable interconnect blocks, each block comprising X upper connections and 2X lower connections;

a plurality of first logic blocks, programmably coupled to said plurality of first programmable interconnect blocks, wherein a first logic block comprises:
  a plurality of second logic blocks; and
  a plurality of second programmable interconnect blocks, programmably coupled to said plurality of second programmable interconnect blocks and said plurality of first programmable interconnect blocks; and a diagnostic interface block for implementing diagnostic and prototyping features, programmably coupled to said plurality of first programmable interconnect blocks.

38. A programmable logic device comprising:

a plurality of first programmable interconnect blocks;

a plurality of first logic blocks, programmably coupled to said plurality of first programmable interconnect blocks, wherein a first logic block comprises:
  a plurality of second logic blocks; and
  a plurality of second programmable interconnect blocks, each programmably coupled to each said plurality of second programmable interconnect blocks and said plurality of first programmable interconnect blocks wherein each second programmable interconnect block has X upper connections and 2X lower connections, wherein X is an integer; and a diagnostic interface block for implementing diagnostic and prototyping features, programmably coupled to said plurality of first programmable interconnect blocks.

* * * * *